United States Patent
Gao

(10) Patent No.: US 11,765,865 B2
(45) Date of Patent: Sep. 19, 2023

(54) DATA CENTER SYSTEM FOR VARIOUS ELECTRONIC RACK ARCHITECTURES

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 124 days.

(21) Appl. No.: 17/412,648

(22) Filed: Aug. 26, 2021

(65) Prior Publication Data
US 2023/0061283 A1   Mar. 2, 2023

(51) Int. Cl.
*H05K 7/20* (2006.01)

(52) U.S. Cl.
CPC ..... *H05K 7/20772* (2013.01); *H05K 7/20272* (2013.01)

(58) Field of Classification Search
CPC .......... H05K 7/20772; H05K 7/20272; H05K 7/20536; H05K 7/20654; H05K 7/2069; H05K 7/20709; H05K 7/20763; H05K 7/20781; H05K 7/2079; H05K 7/20818; H05K 7/20827
See application file for complete search history.

(56) References Cited

U.S. PATENT DOCUMENTS

| | | | | |
|---|---|---|---|---|
| 9,042,099 B2* | 5/2015 | Campbell | ................. | F28F 9/00 361/698 |
| 10,225,958 B1* | 3/2019 | Gao | ................... | H05K 7/20781 |
| 2007/0121294 A1* | 5/2007 | Campbell | ............... | F28F 9/007 165/80.4 |
| 2012/0218711 A1* | 8/2012 | Kashirajima | ........... | F25B 25/00 361/700 |
| 2014/0076520 A1* | 3/2014 | Lu | .............................. | G06F 1/20 165/104.14 |
| 2016/0174417 A1* | 6/2016 | Hachiya | ................. | H05K 7/208 62/504 |
| 2019/0320548 A1* | 10/2019 | Gao | ...................... | H05K 7/1488 |
| 2021/0123685 A1* | 4/2021 | Lee | .................... | H05K 7/20272 |
| 2021/0378150 A1* | 12/2021 | Heydari | ............ | G05B 13/0265 |

* cited by examiner

*Primary Examiner* — Stephen S Sul
(74) *Attorney, Agent, or Firm* — WOMBLE BOND DICKINSON (US) LLP

(57) ABSTRACT

Electronic rack and data center thermal management systems are disclosed. An electronic rack system includes a heat exchange system and the electronic rack having a plurality of servers containing heat-generating components. The heat exchange system includes a filter and a pump to circulate filtered cooling fluid to the electronic rack, via an internal cooling loop. An external cooling loop provides a backup cooling fluid supply to the electronic rack to function as a redundant system for the heat exchange system. The external cooling loop includes an external cooling fluid pump and filter, and is coupled to the internal cooling fluid supply via a valve. The cooling fluid in the internal cooling fluid loop, and its associated filter, are of a higher quality than the cooling fluid and filter of the external cooling fluid loop. In one embodiment, the external cooling loop filter is a high quality filtration system.

20 Claims, 8 Drawing Sheets

DATA CENTER SYSTEM FOR VARIOUS ELECTRONIC RACK ARCHITECTURES

FIELD OF THE INVENTION

Embodiments of the present invention relate generally to data center cooling. More particularly, embodiments of the invention relate to cooling electronic racks with a multiple cooling loops.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of servers in electronic racks in the data center. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling high performance servers.

Existing solutions to cooling an electronic rack containing servers having heat-generating components include a fixed thermal loop designs for a fixed rack architecture. In the event of a failure of the fixed thermal loop cooling system, the servers within the electronic rack that are cooled by the fixed thermal loop will have to be taken out of service while the fixed thermal loop is repaired. Thus, the fixed thermal loop may include a single point of failure in an electronic rack.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
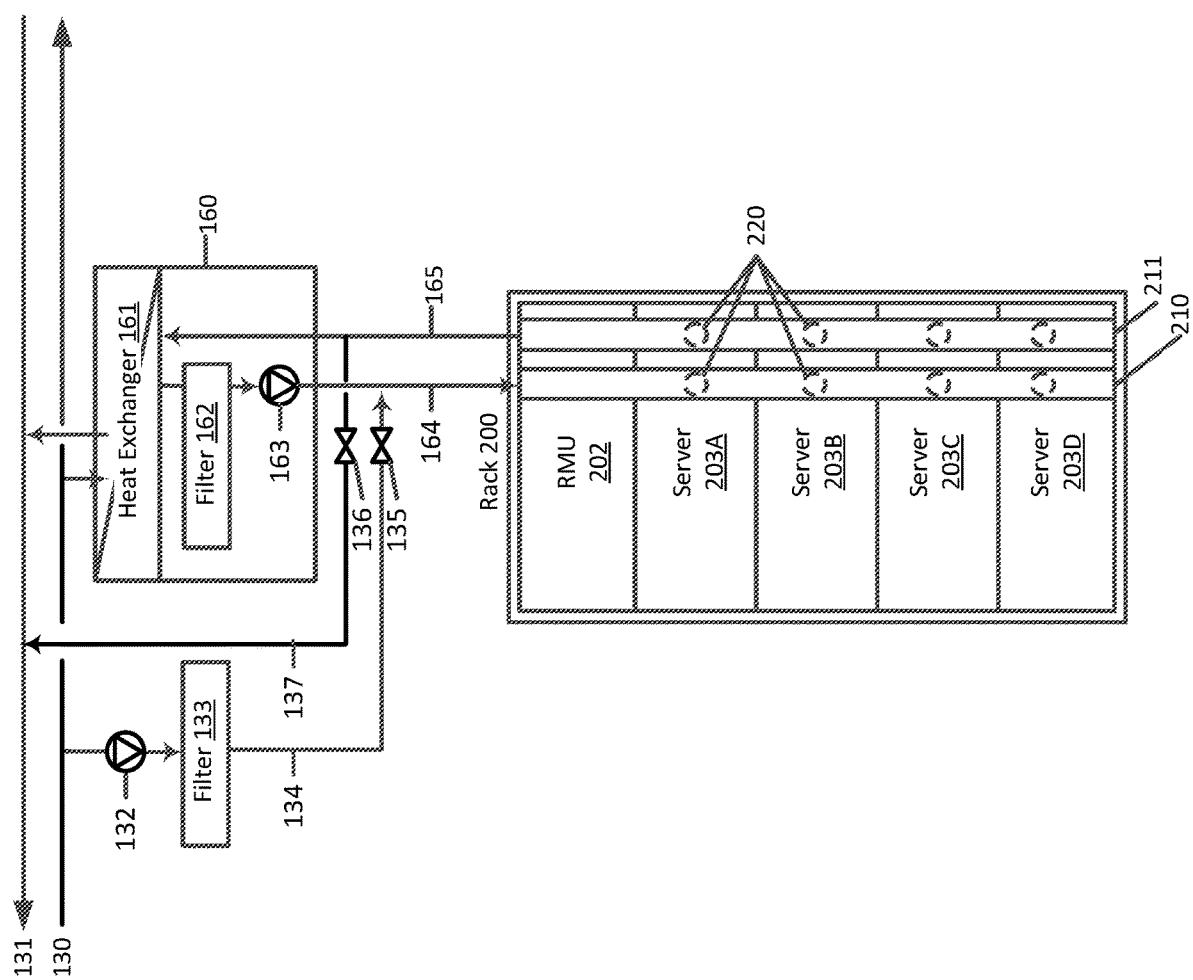
FIG. 1 is a block diagram illustrating an example of a cooling system for an electronic rack, the cooling system having a heat exchange system and an external cooling fluid loop, according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In a first aspect, a cooling system for an electronic rack includes a heat exchange system and an external cooling loop. The heat exchange system includes a heat exchanger, an internal cooling fluid filter, and an internal cooling fluid pump. When the heat exchange system is in an active mode, the heat exchange system is configured to activate the internal cooling fluid pump to deliver internal cooling fluid supply to an electronic rack having at least one server containing a first plurality of heat-generating components, and to cool an internal cooling fluid return from the electronic rack using the heat exchanger. The internal cooling fluid return contains heat transferred from the first plurality of heat-generating components to the internal cooling fluid supply.

The external cooling fluid loop includes an external cooling fluid pump, an external cooling fluid filter, an external cooling fluid supply valve, and an external cooling fluid return valve. When the heat exchange system is in an inactive mode and the external cooling fluid supply valve and external cooling fluid return valve are both open, the external cooling loop is configured to: activate the external cooling fluid pump when the external cooling fluid supply valve and the external cooing fluid return valve are open, and configured to pump filtered external cooling fluid supply to the plurality of heat-generating components in the electronic rack via the internal coolant flow supply line. When the heat exchange system is in the active mode, the external cooling fluid loop is configured to: deactivate the external cooling fluid pump when the external cooling fluid supply valve and the external cooing fluid return valve are both configured to be closed. In an embodiment, the external cooling fluid loop is configured to be in active mode independent of the heat exchange system being in active mode or inactive mode.

In an embodiment, a filtration quality of the internal cooling fluid supply filter is of better quality than a corresponding filtration quality of the external cooling fluid supply filter. In an embodiment, the filtered internal cooling fluid supply is coupled to the one or more heat-generating components via an internal cooling fluid supply manifold installed in the electronic rack, and the first plurality of heat-generating components are coupled to the internal cooling fluid return via an internal cooing fluid return manifold installed in the electronic rack. In embodiment, the electronic rack can further include a second plurality of heat-generating components in the at least one server in the electronic rack. The second plurality of heat-generating components can be coupled to the external cooling fluid supply at a point between the external cooling fluid filter and the external cooling fluid supply valve. The second plurality of heat-generating components can be coupled to the external cooling fluid return at a point between the external cooling fluid return valve and a facility cooling liquid return, and the second plurality of heat-generating components is distinct from the first plurality of heat-generating components. In an embodiment, the cooling system for the electronic rack further includes an external cooling fluid supply manifold and an external cooling fluid return manifold, both installed in the electronic rack, and each coupled to the second plurality of heat-generating components.

In an embodiment, the cooling system for the electronic rack can also include a rack cooler in the electronic rack. The rack cooler can be coupled to the external cooling fluid supply at a point between the external cooling fluid filter and the external cooling fluid supply valve. The rack cooler can also be coupled to the external cooling fluid return at a point between the external cooling fluid return valve and the external cooling liquid return. The rack cooler can provide cooling to any of the first or second plurality of heat-generating components in at least one server in the electronic rack.

In a second aspect, a cooling system for an information technology (IT) cluster includes an external cooling fluid loop and a plurality of heat exchange systems each having an electronic rack associated with the heat exchange system. The external cooling fluid loop can include an external cooling fluid supply coupled to an external cooling liquid source via an external cooling fluid filter, and an external cooling fluid return coupled to an external cooling liquid return. Each heat exchange system in the plurality of heat exchange systems can be associated with an electronic rack having at least one server containing a plurality of heat-generating components, and a heat exchange system. The heat exchange system can include a heat exchanger and an internal cooling fluid pump coupled between the heat exchanger and an internal cooling fluid supply. When the heat exchange system is in an active mode, the heat exchange system is configured to activate the internal cooling fluid supply pump to deliver internal cooling fluid supply from the heat exchanger to the plurality of heat-generating components, and to remove heat from the internal cooling fluid return collected from the heat-generating components. When the heat exchange system is in the active mode, the external cooling fluid supply valve and the external cooling fluid return valve are both closed. The external cooling fluid supply is coupled, via an external cooling fluid supply valve, to the internal cooling fluid supply at a point between the heat exchanger and an inlet of the internal cooling fluid supply pump. The external cooling fluid return is coupled to the internal cooling fluid return via an external cooling fluid return valve.

In an embodiment, each heat exchange system in the plurality of heat exchange systems includes an internal cooling fluid supply manifold and an internal cooling fluid return manifold installed in the electronic rack associated with the heat exchange system. The internal cooling fluid supply manifold is coupled between an outlet of the internal cooling fluid supply pump and the plurality of heat-generating components. The internal cooling fluid supply manifold is configured to distribute internal cooling fluid supply to each server in the at least one server that contains at least one of the plurality of heat-generating components. The internal cooling fluid return manifold is installed in the electronic rack and coupled between the plurality of heat-generating components and the internal cooling fluid return. The internal cooling fluid return manifold is configured to collect the internal cooling fluid return from each server in the electronic rack having at least one of the plurality of heat-generating components. In an embodiment, for each of the heat exchange systems in the plurality of heat exchange systems, when the external cooling fluid supply valve coupled to the internal cooling fluid supply of the heat exchange system is open, and the external cooling fluid return valve coupled to the internal cooling fluid return for the heat exchange system is open, the heat exchange system is configured to deliver external cooling fluid supply to the internal cooling fluid supply pump such that external cooling fluid supply is delivered to the electronic rack. The external cooling fluid supply is heated by the plurality of heat-generating components and the heated external cooling fluid supply is returned via the external cooling fluid return valve to the external cooling fluid return.

In an embodiment, for each heat exchange system in the plurality of heat exchange systems, the external cooling fluid supply valve and the external cooling fluid return valve are configured to open in response to one of: (1) the heat exchanger associated with the electronic rack system being in an inactive state, and that the heat-generating components in the electronic rack are cooled by the external cooling fluid supply, or (2) a temperature of the internal cooling fluid supply being hotter than a threshold value, such that the heat-generating components in the electronic rack are cooled by both the internal cooling fluid supply and the external cooling fluid supply. The external cooling fluid supply filter can be configured for a flow capacity that is capable of delivering external cooling fluid supply to each of the plurality of heat exchange systems in the IT cluster simultaneously, as a full backup to the internal cooling fluid supply in each and every heat exchange system in the plurality of heat exchange systems in the IT cluster.

In an embodiment, in each heat exchange system in the plurality heat exchange systems, the heat exchange system further includes an internal cooling fluid filter coupled between the heat exchanger and the internal cooling fluid supply pump. In an embodiment, a filtration quality of the internal cooling fluid filter is of better quality than a corresponding filtration quality of the external cooling fluid filter.

In a third aspect, a data center can have a plurality of information technology (IT) clusters. Each IT cluster can include an external cooling fluid loop and a plurality of heat exchange systems. The external cooling fluid loop can include an external cooling fluid supply pump coupled to an external cooling liquid source, and an external cooling fluid supply filter coupled to an outlet of the external cooling fluid supply pump. The external cooling loop can further include an external cooling fluid supply coupled to an output of the external cooling fluid filter; and an external cooling fluid return coupled to an external cooling liquid return. Each heat exchange system can include an associated electronic rack having at least one server containing a plurality of heat-generating components. The heat exchange system includes a heat exchanger, an internal cooling fluid filter coupled to the heat exchanger, and an internal cooling fluid pump coupled between the internal cooling fluid filter and an internal cooling fluid supply. When the heat exchange system is in an active mode, the heat exchange system is configured to activate the internal cooling fluid supply pump to deliver internal cooling fluid supply from the heat exchanger to the plurality of heat-generating components, and to remove heat collected from the plurality of heat-generating components. The heat is transferred to the internal cooling fluid return. For each heat exchange system in an IT cluster, when the heat exchange system is in the active mode, the external cooling fluid supply valve and the external cooling fluid return valve are both closed. In an embodiment, the external cooling fluid supply is coupled, via an external cooling fluid supply valve, to the internal cooling fluid supply and the external cooling fluid return is coupled to the internal cooling fluid return via an external cooling fluid return valve. For each IT cluster, for each heat exchange system in the IT cluster, a filtration quality of the internal cooling fluid filter is of a better quality than a corresponding filtration quality of the external cooling fluid filter. In an embodiment, for each IT cluster in the plurality of IT clusters, the outlet of the external cooling liquid supply pump is coupled to the outlet of the external cooling liquid supply pump in each of the other IT clusters in the plurality of IT clusters in the data center. In such an embodiment, each external cooling fluid supply pump is configured to be a full backup for the external cooling fluid supply pump for each IT cluster in the plurality of IT clusters in the data center.

In an embodiment, the external cooling fluid supply pump for each IT cluster is sized and configured to be a full backup for the external cooling fluid supply pump of each and every other IT cluster in the plurality of IT clusters in the data center. In an embodiment, for each IT cluster, and for each of the heat exchange systems in the plurality of heat exchange systems in the IT cluster, when the external cooling fluid supply valve coupled to the internal cooling fluid supply of the heat exchange system is open, and the external cooling fluid return valve coupled to the internal cooling fluid return for the heat exchange system is open, then the external cooling fluid supply is delivered to, and heated by, the plurality of heat-generating components within the electronic rack associated with the heat exchange system. The heated external cooling fluid supply is returned via the external cooling fluid return valve to the external cooling fluid return, and is passed to the external cooling liquid return. In an embodiment, for each IT cluster, for each heat exchange system in the plurality of heat exchange systems, the external cooling fluid supply valve and the external cooling fluid return valve are configured to open in response to one of: (1) the heat exchanger for the heat exchange system being in an inactive state, such that the heat-generating components in the electronic rack associated with the heat exchange system are cooled by the external cooling fluid supply after the external cooling fluid supply valve and external cooling fluid return valve are opened, or (2) a temperature of the internal cooling fluid supply being hotter than a threshold value, such that the heat-generating components in the electronic rack associated with the heat exchange system are cooled by both the internal cooling fluid supply and the external cooling fluid supply after the external cooling fluid supply valve and external cooling fluid return valve are opened.

FIG. 1 is a block diagram illustrating an example of a cooling system 100 for an electronic rack. The cooling system can have a heat exchange system 160 and an external cooling fluid loop, according to one embodiment. The external cooling fluid loop can be used to provide a backup cooling system for an internal cooling loop that is coupled to the heat exchange system 160.

The heat exchange system 160 can include a heat exchanger 161, an internal cooling fluid filter 162, an internal cooling fluid pump 163, and an internal cooling loop that includes an internal cooling fluid supply 164 and an internal cooling fluid return 165. The external cooling fluid supply 134 can have an external cooling fluid filter 133. In an embodiment, the internal cooling fluid filter 162 is a high quality filter that can filter, e.g., less than 100 micron particulates out of the internal cooling fluid supply 164. An external cooling fluid filter 133 can filter, e.g., greater than 200 micron particulates out of the external cooling fluid supply 134. Regardless of any particular filtering specification value(s), internal cooling fluid filter 162 is configured to provide a higher quality of filtration than the external cooing fluid filter 133 of the external cooling fluid supply 134. Higher quality of filtration than the external cooling fluid filter 133 can include the internal cooling fluid filter 162 filtering out smaller particulates, filtering across a broader temperature range, having longer service life such that down-time to service the internal cooling fluid filter 162 is reduced, or having faster return-to-service time (e.g. easier to clean, replace, or easier to access) than the external cooling fluid filter 133.

The cooling fluid within the internal cooling loop of the heat exchange system 160 can have a different grade or different inhibitors within the cooling fluid than the cooling fluid within the external cooling loop.

The internal cooling fluid loop continuously circulates internal cooling fluid to an electronic rack 200 to remove heat from heat-generating components (not shown) within one or more servers, e.g. servers 203A-203D (individually and collectively, server 203) in the electronic rack 200. The heat is removed from the heat-generating components and transferred to one or more cold plates (not shown) that are cooled by internal cooling fluid supply 164. Cold plates are described in detail, below, with reference to FIG. 8. Heated internal cooling fluid supply 164 is returned to the heat exchange system 160 as internal cooling fluid return 165. Heat exchanger 161 removes the heat from internal cooling fluid return 165 to become internal cooling fluid supply 164. Internal cooling fluid supply 164 is then circulated through internal cooling fluid filter 162 and pumped to the electronic rack 200 by internal coolant fluid pump 163 as internal cooling fluid supply 164.

Heat exchanger 161 can be any type of heat exchanger including a tube-bundle counter-flow liquid-to-liquid cooling, an air-to-liquid heat exchanger, an evaporative cooling heat exchanger with a condenser or quenching system, or other type of heat exchanger. In an embodiment, a cooling fluid in the internal cooling fluid loop can be a two-phase coolant and the heat-exchanger comprises a condenser. Heat exchanger 161 is coupled to an external cooling liquid source 130 that provides a source of cooling liquid to the heat exchanger 161. Heat removed by the heat exchanger 161 can be transferred to the external cooling liquid return 131.

Electronic rack 200 can include an internal cooling fluid supply manifold 210 and an internal cooling fluid return manifold 211 installed in the electronic rack 200. Internal cooling fluid supply 164 is coupled to the internal cooing fluid supply manifold 210. Internal cooling fluid supply manifold 210 distributes internal cooling fluid supply 164 to any server 203 in the electronic rack 200 having heat-generating components to be cooled by the internal cooling fluid supply 164. Similarly, these same servers 203 can couple via connections 220 to the internal cooling fluid return manifold 211 to return the heated internal cooling fluid return 165 back to the heat exchange system 160.

Electronic rack 200 can further include optional rack management unit (RMU) 202. RMU 202 can be configured to provide and manage power supplied to servers 203. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.) to provide power to the rest of the components of electronic rack 200.

In one embodiment, RMU 202 includes optimization module 221 (not shown) and rack management controller (RMC) 222 (not shown). RMC 222 may include a monitor to monitor operating status of various components within electronic rack 200, such as, for example, severs 203, and any fan modules (not shown) that may be providing air cooling within electronic rack 200 and/or server(s) 203. RMC 222 can receive operating data from various sensors (not shown) representing the operating environments of electronic rack 200. For example, the monitor may receive operating data representing temperatures of the processors, cooling liquid, and airflows, which may be captured and collected via various temperature sensors. The monitor may also receive data representing the fan power and pump power generated by the fan modules (not shown) and liquid pump (not shown), which may be proportional to their respective speeds. These operating data are referred to as real-time operating data. Note that the monitor may be implemented as a separate module within RMU 202.

The cooling system 100 for the electronic rack 200 includes an external cooling fluid loop. The external cooling fluid loop can provide a temporary backup source of cooling fluid to the electronic rack 200 in the event that the internal cooling fluid loop experiences a failure or requires service. The external cooling fluid loop includes an external cooling fluid pump 132, an external cooling fluid filter 133, external cooling fluid supply 134, and external cooling fluid return 137. An inlet of the external cooling fluid pump 132 is coupled to an external cooling liquid source 130, which can be a facility cooling liquid supply. An inlet of external cooling fluid filter 133 can be coupled to an outlet of external cooling fluid pump 132. An outlet of external cooling fluid filter 133 is coupled to internal cooling fluid supply 164 via an external cooling fluid supply valve 135. External cooling fluid return 137 can be coupled to external cooling liquid return 131 via external cooling fluid return valve 136.

In an active mode of the internal cooling loop, the heat exchange system 160 is active (ON), including heat exchanger 161, internal cooling fluid filter 162, and internal cooling fluid pump 163. In internal cooling loop active mode, internal cooling fluid pump 163 pumps filtered internal cooling fluid supply 164 to electronic rack 200. Electronic rack 200 returns internal cooling fluid return 165 to heat exchanger 161 to be cooled. In active mode of the internal cooling loop, the external cooling loop is inactive. In inactive mode, the external cooling fluid pump 132 is inactive (OFF), external cooling fluid supply valve 135 is closed, and external cooling fluid return 136 is closed. With the internal cooling loop active, and the external cooling loop inactive, internal cooling fluid is circulated to the electronic rack 200 and returned to heat exchange system 160.

In an inactive mode of the internal cooling loop, the heat exchange system 160 is inactive (OFF), including heat exchanger 161, internal cooling fluid filter 162, and internal cooling fluid pump 163, such that no internal cooling fluid is circulated to the electronic rack 200. Internal cooling loop can be in inactive mode in at least two circumstances. First, when the electronic rack 200 is down for service, no cooling fluid (internal or external) should be circulating to the electronic rack 200. Second, when the internal cooling loop, or one of its components (heat exchanger, pump, or filter) has failed or needs service, then the heat exchange system is put into inactive mode. In the second case, the external cooling loop can be put into active mode to provide a backup supply of cooling fluid to electronic rack 200. In external cooling loop active mode, the external cooling fluid pump 132 is active (ON), external cooling fluid supply valve 135 is open, and external cooling fluid return 136 is open.

Table I

| Internal Loop | External Loop | Cooling liquid circulating to rack |
|---|---|---|
| Active mode | Inactive mode | Internal cooling fluid |
| Inactive mode | Inactive mode | None. Rack is down for service |
| Inactive mode | Active mode | External cooling fluid (backup supply) |

In an embodiment, heat exchange system 160 can include one or more sensors (not shown) that are monitored by RMU 202. External cooling fluid supply valve 135 and external cooling fluid valve 136 can be flow control valves that are actuated by RMU 202 in response to the one or more sensors in the heat exchange system 161 and logic in the RMU 202. The one or more sensors can detect one or more failures in the heat exchanger system 161, such as a lack of flow of the external cooling liquid source to the heat exchanger 161, an over-temperature condition of the internal cooling fluid loop, a pressure drop across the internal cooling fluid filter 162 indicating that the filter 162 is blocked, or a low flow condition at the outlet of the internal cooling fluid pump 163 indicating a problem with the pump 163. In response to RMU 202 detecting a failure, RMU 202 can put the heat exchange system 161 into inactive mode, open the external cooling fluid supply and return valves 135 and 136, respectively, and put the external cooling loop in active mode as a temporary backup for the internal cooling loop. When RMU 202 detects that the failure in the heat exchange system 161 is remedied, and/or in response to a manual reset or input, RMU 202 can put the external cooling loop in inactive mode, close the external cooling fluid supply and return valves 135 and 136, respectively, and put the heat exchange system 161 back into active mode. In an embodiment, RMU 202 can smoothly transition between operating modes such that at least one the internal cooling loop or external cooling loop is active at all times when the servers 203 in the electronic rack 200 are active and generating heat.

In an embodiment, heat exchange system 160 can be incorporated with the electronic rack 200, such as a rack mounted unit.

Figure 2:
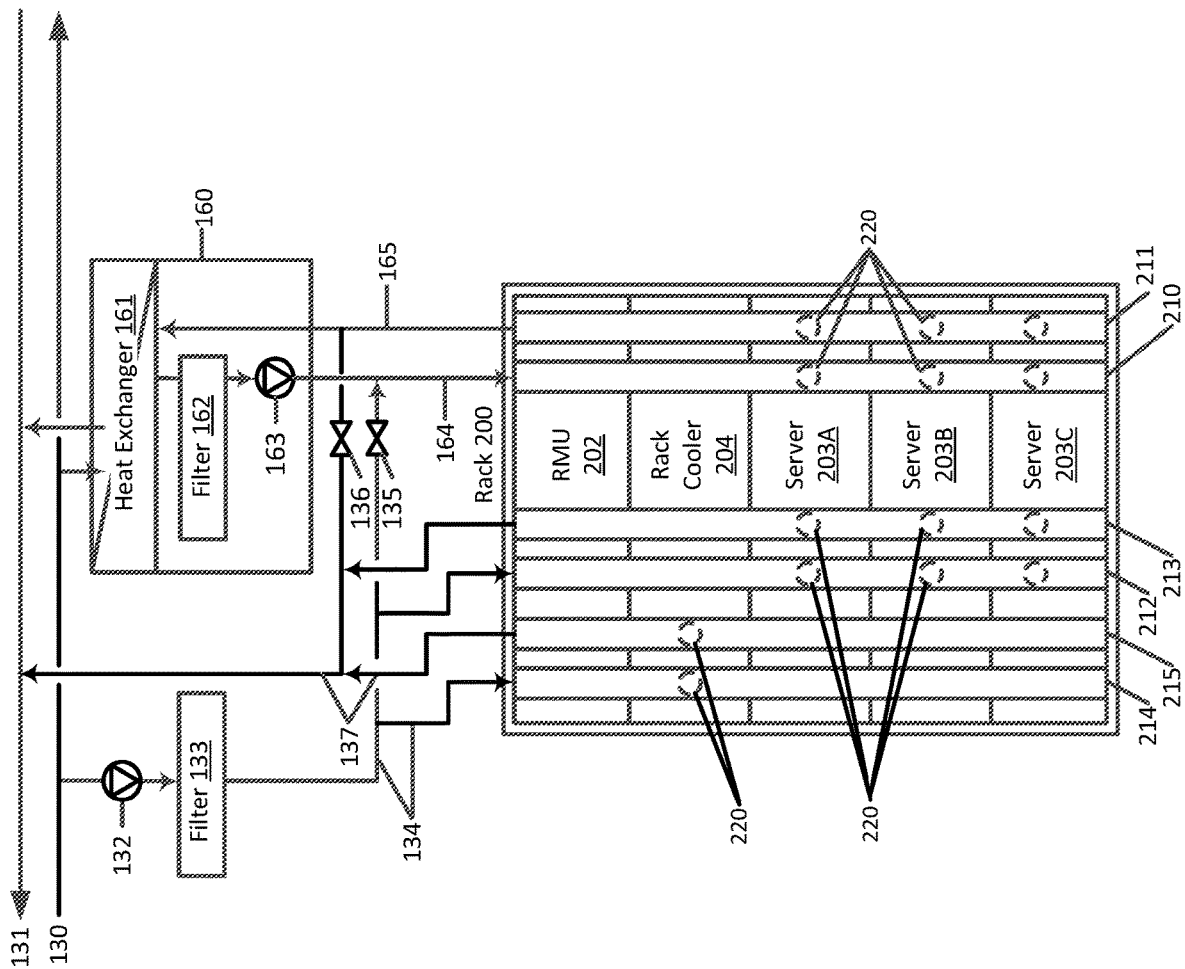
FIG. 2 is a block diagram illustrating an example of a cooling system for an electronic rack, the cooling system having a heat exchange system and an external cooling loop, according to one embodiment.

FIG. 2 is a block diagram illustrating an example of a cooling system 150 for an electronic rack 200 having a heat exchange system 160 and an external cooling loop, according to one embodiment. The heat exchange system 160 in FIG. 2 can be substantially as described above with respect to FIG. 1 with the following operational differences in view of added functionality of the external cooling loop described in FIG. 2. The external cooling loop can provide the backup cooling functionality described above with reference to FIG.

1. In FIG. 2, the external cooling loop can also provide additional cooling functionality to electronic rack 200. The components that make up the external cooling loop can be substantially as described above with reference to FIG. 1, with the following additional features.

In FIG. 2, the external cooling loop can provide pumped filtered external cooling fluid to a second plurality of heat-generating components within one or more servers 203 within the electronic rack 200. The external cooling fluid loop can provide external cooling fluid supply 134 to the second plurality of heat-generating components, independent of the operating mode (active or inactive) of the internal cooling loop. Logic within the RMU 202 can control operation and coordination of the operating modes of the internal cooling loop and external cooling loop.

A first branch off of the external cooling fluid supply 134 can be taken from a point between the external cooling fluid filter 133 and the external cooling fluid supply valve 135. The first branch can be routed to an external cooling fluid supply manifold 212 installed in the electronic rack 200. The one or more servers 203 having the second plurality of heat-generating components can couple to the external cooling fluid supply manifold 212 to provide external cooling fluid supply 134 to one or more cold plates (not shown) that remove heat from the second plurality of heat-generating components and transfer the heat to external cooling fluid return manifold 213. External cooling return manifold 213 can be coupled to external cooling fluid return 137 at a point between external cooling fluid return valve 136 and external cooling liquid return 131. The one or more servers 203 having the second plurality of heat-generating components can couple to the external cooling fluid supply and return manifolds 212 and 213 at connection points 220. In an embodiment, the first branch external cooling fluid supply 134 can have an isolation valve (not shown) that isolates the external cooling fluid supply manifold 212 from receiving external cooling fluid supply 134. Similarly, the first branch external cooling fluid return 137 can have an isolation valve (not shown) that isolates the cooling fluid return manifold 213 from the external cooling fluid return 137. In such an embodiment, the two isolation valves (not shown) can be manually controlled or controlled via RMU 202 such that the one or more servers 203 having the second plurality of heat-generating components can be serviced.

The external cooling loop can further provide pumped filtered external cooling fluid (134) to any of the first and/or second plurality of heat-generating components within the one or more servers 203 within the electronic rack 200. A second branch off of the external cooling fluid supply 134 can be taken from a second point between the external cooling fluid filter 133 and the external cooling fluid supply valve 135. The second branch can be routed to a second external cooling fluid supply manifold 214 within the electronic rack 200. The electronic rack 200 can include a rack cooler 204. Rack cooler 204 can distribute external cooling fluid supply 134 to cold plates (not shown) within the one or more servers 203 having the third plurality of heat-generating components. Rack cooler 204 can return the heated external cooling fluid supply 134 to an external cooling fluid return manifold 215 within the electronic rack 200. Rack cooler 204 operation can be controlled by RMU 202. In an embodiment, one or more sensors (not shown) attached to the one or more cold plates (not shown) can be monitored by RMU 202 to facilitate operation of rack cooler 204. The one or more sensors can include thermal sensors, e.g. at the one more cold plates, one or more flow sensors that monitor flow of coolant circulated by the rack cooler 204, and the like. In an embodiment, the second branch external cooling fluid supply 134 can have an isolation valve (not shown) that isolates the external cooling fluid supply manifold 214 from receiving external cooling fluid supply 134. Similarly, the second branch external cooling fluid return 137 can have an isolation valve (not shown) that isolates the cooling fluid return manifold 215 from the external cooling fluid return 137. In such an embodiment, the two isolation valves (not shown) can be manually controlled or controlled via RMU 202 such that the one or more servers 203 having the third plurality of heat-generating components can be serviced.

The external fluid loop can be designed, including pipe sizing, pump 132 capacity, and filter 133 capacity, to provide external cooling fluid sufficient to cool any, or all, of the heat-generating components within servers 203 within electronic rack 200.

Figure 3:
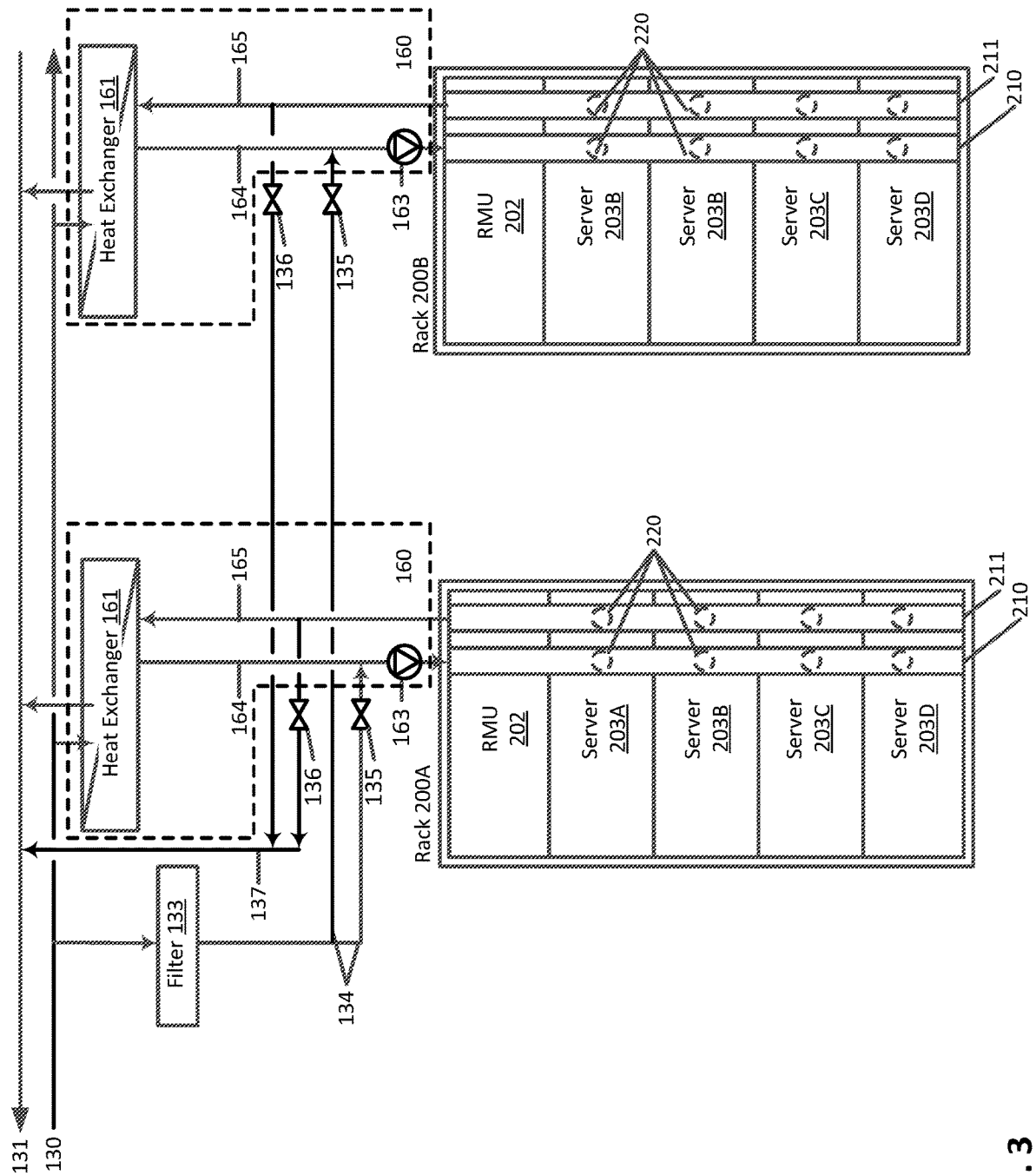
FIG. 3 is a block diagram illustrating an example of a cooling system for an information technology (IT) cluster, the cooling system having an external cooling fluid loop and a plurality of electronic rack, each having one or more servers having a plurality of heat-generating components and a heat exchange system, according to one embodiment.

FIG. 3 is a block diagram illustrating an example of a cooling system for an information technology (IT) cluster 300 having an external cooling fluid loop and a plurality of heat exchange systems, each having an associated electronic rack 200 having one or more servers 203 each having a plurality of heat-generating components, and heat exchanger 161, according to one embodiment.

Operation of the cooling system for an IT cluster 300 can be substantially as described above with reference to FIG. 1, and extended to accommodate a plurality of electronic racks 200, with additional features and distinctions as described below. In an embodiment, as shown in FIG. 3, the heat exchange system 160 does not include internal cooling fluid filter 162.

In FIG. 3, the external cooling fluid loop is configured as a backup cooling fluid source for each, or all, of the plurality of heat exchange systems in the data center 300. A key concept of this redundant design for system backup is to change the external cooling fluid to an internal cooling fluid. Each heat exchange system 160 includes a heat exchanger 161, internal cooling fluid loop having internal cooing fluid supply 164 and internal cooling fluid return 165, and internal cooling fluid pump 163. The heat exchange system cools heat-generating components in an associated electronic rack 200. In FIG. 3, for each heat exchange system, the external cooling loop is coupled to the internal cooling fluid supply 164 of the heat exchange system via an external cooling fluid supply valve 135. In a difference from the cooling system for an electronic rack of FIG. 1, the external cooling fluid supply 134 in FIG. 3 to each heat exchange system 160 can be coupled to the internal cooling fluid supply 164 for the heat exchange system 160 at a point between the internal cooling loop heat exchanger 161 and the internal cooling fluid pump 163. In the configuration of FIG. 3, for each heat exchange system 160, internal cooling fluid pump 163 can supply a cooling fluid (either internal cooling fluid supply 164 or external cooling fluid supply 134) to internal cooling fluid supply manifold 210. In the configuration of FIG. 3, for each heat exchange system 160, cooling fluid pump 163 is active whenever either the heat exchange system 160 is active or the external cooling fluid supply valve 135 and external cooling fluid return valve 136 are open. The cooling fluid pump 163 of a heat exchange system 160 is inactive whenever the heat exchanger 161 is inactive and the external cooling fluid supply valve 135 and external cooling fluid return valve 136 are both closed.

For each heat exchange system 160 and associated electronic rack 200 in the IT cluster 300, when the heat exchange system 160 is in active mode (ON), an internal cooling fluid supply 164 is provided to cooling fluid pump 163. In the active mode of the heat exchange system 160, the external cooling loop is inactive to the heat exchange system 160 such that the external cooling fluid supply valve 135 and external cooling fluid return valve 136 are both closed. In an inactive mode of the heat exchange system 160, the heat exchanger 161 can be inactive (OFF). In an active mode of the external cooling loop for a heat exchange system 160, the external cooling fluid supply valve 135 and external cooling fluid return valve 136 for the heat exchange system 160 are both open, and the internal cooling fluid pump 163 is ON. The inactive heat exchange system 160 can have multiple causes, such as any failure on the internal cooling fluid loop or service interruption of the heat exchange system 160.

For each heat exchange system 160 and associated electronic rack 200 in the IT cluster 300, an operating mode for the external cooling fluid loop and heat exchange system 160 can be managed independently from each other heat exchange system 160 in the IT cluster 300. For example, an operating mode (active or inactive) of the heat exchanger 161 in a first heat exchange system 160 can be different from an operating mode (active or inactive) of a second heat exchange system in the IT cluster. A rack management unit (RMU) 202 in an electronic rack, e.g. 200A or 200B, associated with a heat exchange system 160 can control the operating mode (active or inactive) for the heat exchange system 160 and the external cooling loop for the heat exchange system 160. Control of the operating modes of the heat exchange system 160 can include controlling an open/closed state of the external cooling fluid supply valve 135 and return valve 136, control of a speed, or ON/OFF state, of cooling fluid supply pump 163, control of an ON/OFF state of the heat exchanger 161, and other controllable elements within the heat exchange system 160 and associated electronic rack 200.

Figure 4:
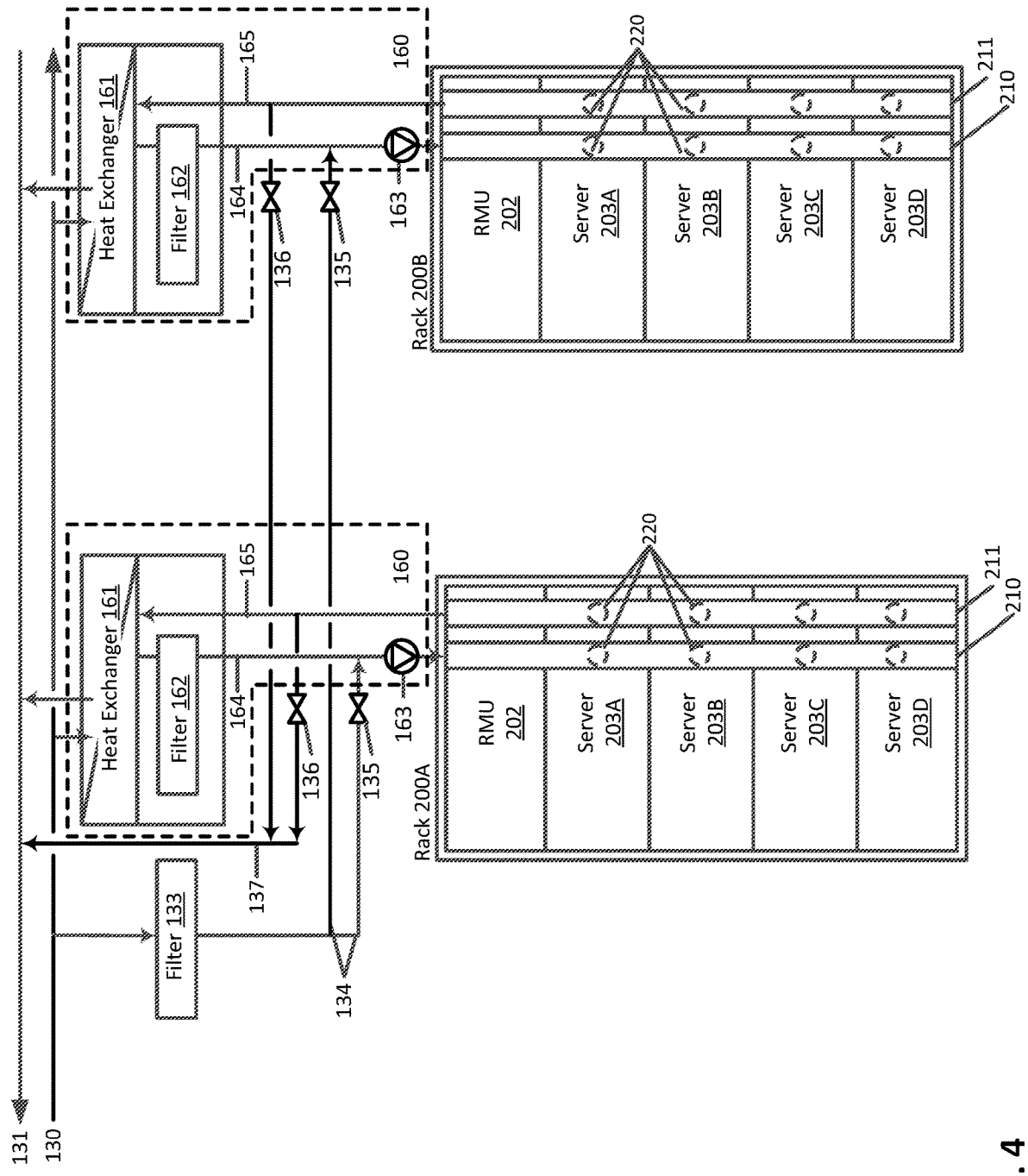
FIG. 4 is a block diagram illustrating an example of a cooling system for an information technology (IT) cluster, the cooling system having an external cooling fluid loop and a plurality of electronic racks, each having one or more servers having a plurality of heat-generating components and a heat exchange system, according to one embodiment.

FIG. 4 is a block diagram illustrating an example of a cooling system for an information technology (IT) cluster 400 having an external cooling fluid loop and a plurality of heat exchange systems 160, each having an associated electronic rack 200 having a plurality of heat-generating components according to one embodiment.

Embodiments according to FIG. 4 can be substantially identical to embodiments of FIG. 3, with the exception that, for each heat exchange system 160, an internal cooling fluid filter 162 is provided in heat exchange system 160 and internal cooling fluid supply 164 is filtered by filter 162. As described above, internal cooing fluid filter 162 provides a higher quality of filtration for at least one filter quality specification than external cooling fluid filter 133. The internal cooling fluid filter 162 can be coupled between the heat exchanger 161 and the internal cooling fluid pump 163. Operating modes of the heat exchange system 160 are substantially identical to the operating modes of each heat exchange system 160 in FIG. 3.

Figure 5:
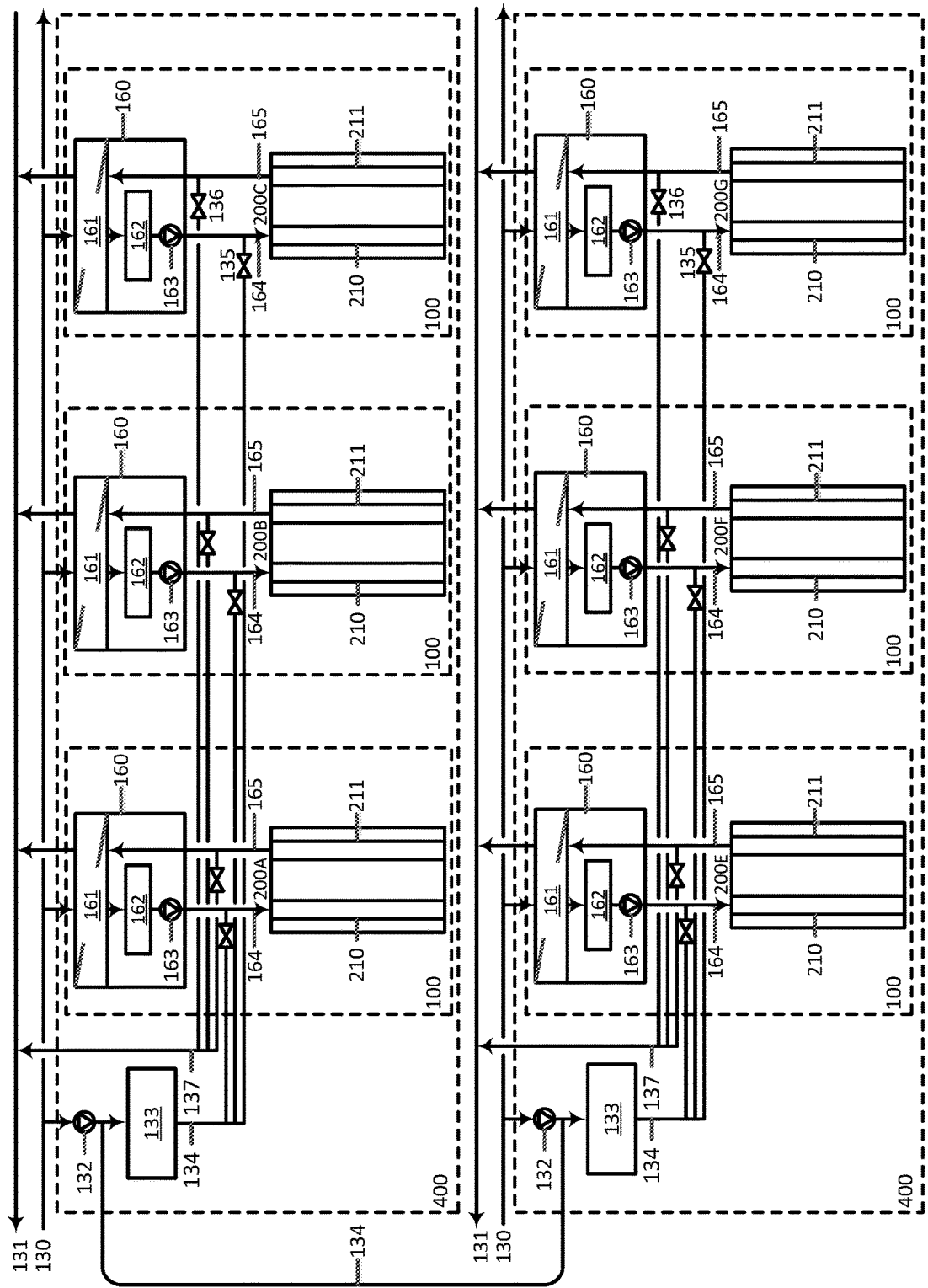
FIG. 5 is a block diagram illustrating an example of a data center having a plurality of cooling systems, each cooling system having an external fluid cooling loop and an associated IT cluster, according to one embodiment.

FIG. 5 is a block diagram illustrating an example of a data center 500 having a plurality of cooling systems for an information technology (IT) cluster (e.g. two cooling systems each having an associated IT cluster 400). Each cooling system and associated IT cluster, e.g. IT cluster 400, comprises a plurality of cooling systems for an electronic rack, e.g. cooling system 100 for an electronic rack 200 as described with reference to FIG. 1. Although cooling system with associated IT cluster 400 and cooling system for an electronic rack 100 are used for describing FIG. 5, any of the cooling systems for an electronic rack within this disclosure can be configured into a cooling system for an IT cluster. In an embodiment, a first cooling system for an associated IT cluster can differ from a second cooling system for an associated IT cluster in the data center.

In FIG. 5, each cooling system 400 and associated IT cluster includes an external cooling fluid pump 132, an external cooling fluid filter 133 and a plurality of branches off of the external cooling fluid supply 134 and external cooling fluid return 137. Each branch off of the external cooling fluid supply 134 is coupled to the internal cooling fluid loop of one of the electronic rack systems 100 via external cooling fluid supply valve 135. Each branch off of the external cooling fluid return 137 is coupled the internal cooling fluid loop of one of the electronic rack systems via external cooling fluid return valve 136. The external cooling fluid pump 132 pumps external cooling fluid 134 through external cooling fluid filter 133 whenever any of the cooling systems 100 for an electronic rack 200 in the cooling system 400 for an IT cluster are in an operating mode wherein the heat exchange system 160 is in the inactive mode and the external cooling fluid loop is in an active mode. When the external cooling fluid loop is in the active mode, the external cooling fluid pump 132 for the data center system 400 is active (ON) and external cooling fluid supply valve 135 and return valve 136 for the cooling system 100 for an electronic rack 200 are both in an OPEN state. A key feature is that the external cooling fluid supply 134 enables the two external cooling fluid pumps 133 to function as redundant for each other. In addition, if the two cooling liquid supply 130 and return 131 loops are independent systems, the cross-over external cooling fluid supply 134 from the outlet of one external cooling fluid pump 133 to the other external cooling fluid pump 133 enables each of the two external cooling fluid pumps 133 to be a backup for the other.

The external cooling fluid loop for one cooling system 400 for an IT cluster is also configured to be a backup supply of external cooling liquid 130 to another cooling system 400 for an IT cluster in the data center 500. As such, an output of external cooling fluid pump 132 in one cooling system 400 for an IT cluster is coupled to an output of external cooling fluid pump 132 of each other cooling system 400 for an IT cluster in the data center 500. Thus, if one external cooling fluid pump 132 fails in one cooling system 400 for an IT cluster, the external cooling fluid pump 132 at least one other cooling system 400 can be activated to provide a source of external cooling fluid 134 to the cooling system 400 for an IT cluster having the failed external cooling fluid pump 132. In an embodiment, the external cooling fluid pump 132 in at least one cooling system 400 for an IT cluster is designed such that the external cooling fluid pump 132 can provide a backup supply of external cooling fluid 134 to each cooling system 100 for an electronic rack in each cooling system 400 for an IT cluster in data center 500.

Figure 6:
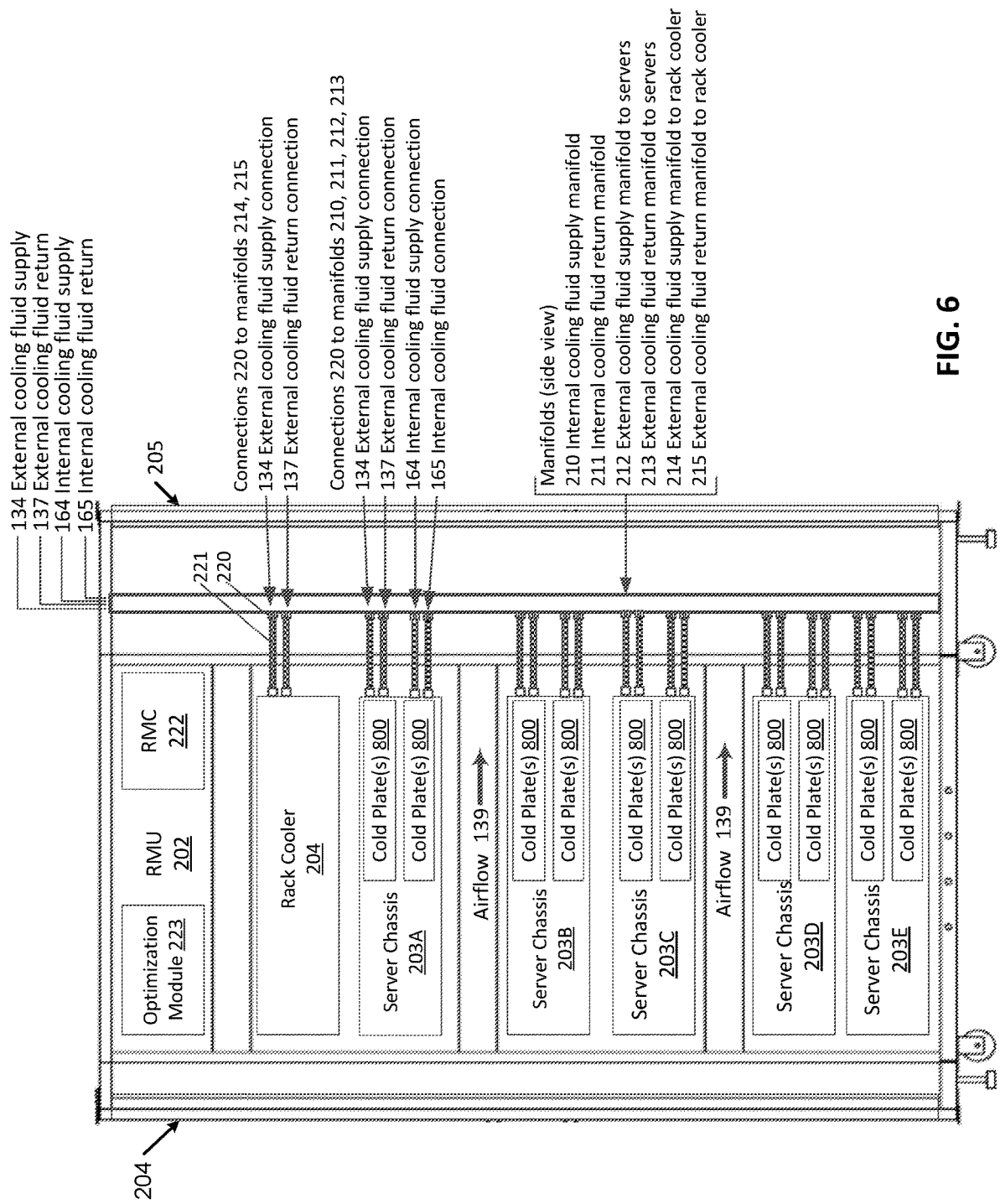
FIG. 6 is a block diagram illustrating an example of a side view of an electronic rack, according to one embodiment.

FIG. 6 is a block diagram illustrating an example of a side view electronic rack 200, according to one embodiment. Electronic rack 200 may represent any of the electronic racks 200 as shown in FIGS. 1 through 5, such as, for example, electronic rack 200 of FIG. 1, electronic racks 200A and 200B of FIGS. 3 and 4, and electronic racks 200A-200G in FIG. 5.

Referring to FIG. 6, according to one embodiment, electronic rack 200 can include, but is not limited to, rack management unit (RMU) 202, rack cooler 204, and one or more server chassis 203A-203E (collectively referred to as server chassis 203). Server chassis 203 can be inserted into an array of server slots (e.g., standard shelves) respectively from front end 204 or back end 205 of electronic rack 200. Note that, although there are five server chassis 203A-203E shown here. More or fewer server chassis 203 may be maintained within electronic rack 200.

In addition, for at least some of the server chassis 203, an optional fan module (not shown) is associated with the server chassis 203. Each of the fan module(s) (not shown) includes one or more cooling fans. The fan modules may be mounted on the back ends of server chassis 203, or on the electronic rack 200, to generate airflows 139 flowing from front end 204, traveling through the air space of the sever chassis 203, and exiting at back end 205 of electronic rack 200. In an embodiment, electronic rack 200 can be either open to the environment or partially contained by a rack container, as long as the fan modules (not shown) can generate airflow 139 from the front end 204 to the back end 205.

Each of server chassis 203 may include one or more information technology (IT) components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 203 may include a host server (referred to as a host node) coupled to one or more compute servers (also referred to as computing nodes, such as CPU server and GPU server).

A host server 203 (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The computer servers perform the actual tasks, which may generate heat during the operations.

Electronic rack 200 can further include optional RMU 202 configured to provide and manage power supplied to servers 203, and CDU 201. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.) to provide power to the rest of the components of electronic rack 200.

In an embodiment, RMU 202 includes optimization module 221 (not shown) and rack management controller (RMC) 222. RMC 222 may include a monitor to monitor operating status of various components within electronic rack 200, such as, for example, computing nodes 203, and the fan modules. Specifically, the RMC 222 receives operating data from various sensors representing the operating environments of electronic rack 200. Electronic rack 200 can also include rack cooler 204 having one or more liquid pumps (not shown). RMC 222 can monitor operating data representing temperatures of the processors, cooling liquid, and airflows, which may be captured and collected via various temperature sensors. The monitor may also receive data representing the fan power and pump power generated by the fan modules (not shown) and liquid pump(s) (not shown) of rack cooler 204, which may be proportional to their respective speeds. These operating data are referred to as real-time operating data. Note that the monitor may be implemented as a separate module within RMU 202.

The rack configuration as shown in FIG. 6 is shown and described for the purpose of illustration only; other configurations or arrangements may also be applicable. The cold plate(s) 800 of server chassis 203 may be coupled to a rack manifold, e.g. 210-213, which may be directly coupled to external cooling fluid supply 134 and return 137 or by internal cooling fluid supply 164 and return 165. Rack cooler 204 can be coupled to external cooling fluid supply 134 and return 135, via external cooling fluid supply manifold 214 and return manifold 215. Rack cooler 204 circulates external cooling fluid within one or more cold plate(s) 800 within one or more servers 203 within the electronic rack 200. An embodiment using a rack cooler 204 is described with reference to FIG. 2, above. In an embodiment, a first plurality of heat-generating components in one or more servers 203 can be cooled using internal cooling fluid supply 164 and return 165. A second plurality of heat-generating components within one or more servers 203 can be cooled using external cooling fluid supply 134 and return 137. Either, or both, of the first and/or second plurality of heat-generating components in one or more servers 203 can be cooled using external cooling fluid supply 134 and return 137 circulated via rack cooler 204 and/or internal cooling fluid supply 164 and return 165.

Although not shown, a power supply unit may be disposed within electronic rack 200. The power supply unit may be implemented as a standard chassis identical or similar to a sever chassis, where the power supply chassis can be inserted into any of the standard shelves, replacing any of server chassis 203. In addition, the power supply chassis may further include a battery backup unit (BBU) to provide battery power to server chassis 203 when the main power is unavailable. The BBU may include one or more battery packages and each battery package include one or more battery cells, as well as the necessary charging and discharging circuits for charging and discharging the battery cells.

Figure 7:
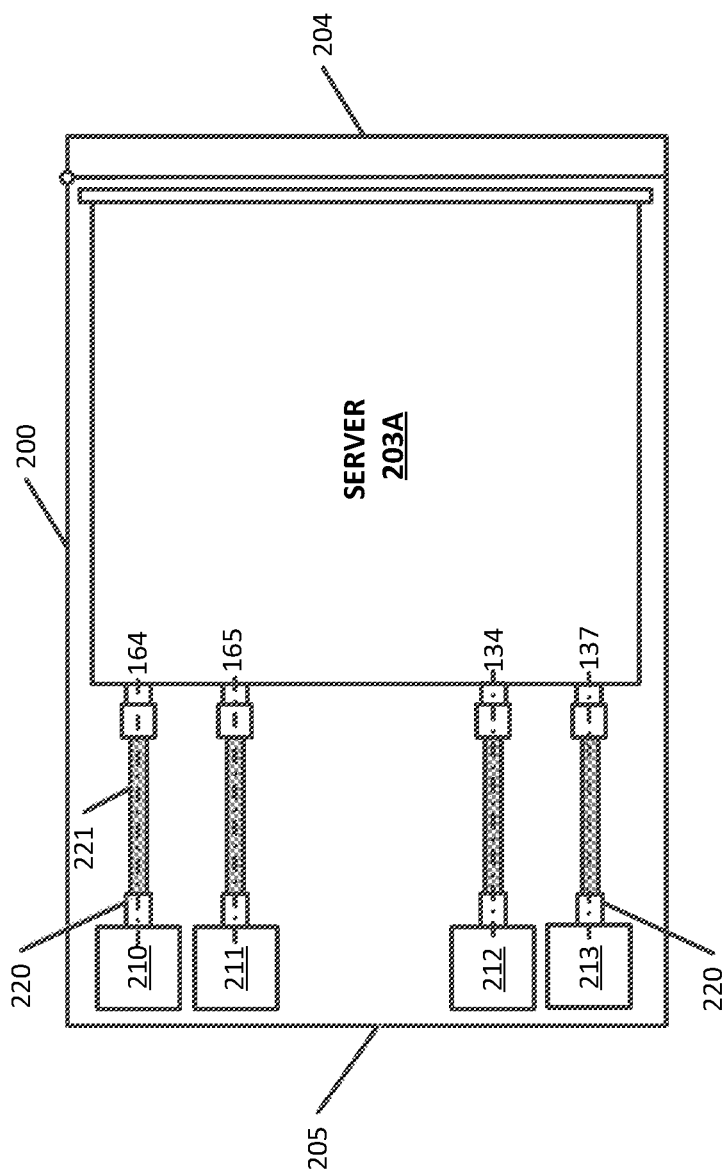
FIG. 7 is a block diagram illustrating an example of a top view of an electronic rack, according to one embodiment.

FIG. 7 is a block diagram illustrating an example of a top view electronic rack 200, according to one embodiment. An example server 203A is shown and can represent any server 203 within electronic rack 200. The front of the electronic rack 200 is labeled 204, while the rear of the electronic rack 200 is labeled 205.

As described above, internal cooling fluid supply 164 and return 165 can be coupled to internal cooling fluid supply manifold 210 and return manifold 211, respectively. Server 203A can include connection points to couple a supply hose 221 from a connection point 220 on internal cooling supply manifold 210 and return manifold 211 to circulate internal cooling fluid to cold plate(s) (not shown). The cold plate(s) (not shown) can be coupled to a first plurality of heat-generating components within server 203. Server 203A can including connection points to couple a supply hose 221 from a connection point 220 on external cooling fluid supply manifold 212 and return manifold 213 to circulate external cooling fluid to cold plate(s) (not shown) coupled to a second plurality of heat-generating components within server 203.

Any server 203 having one of the first plurality of heat-generating components can couple to manifolds 210 and 211 in electronic rack 200 using a hose connection 221. Similarly, any server having a one of the second plurality of heating generating components can be coupled to manifolds 212 and 213 in electronic rack 200 using a hose connection 221.

Figure 8:
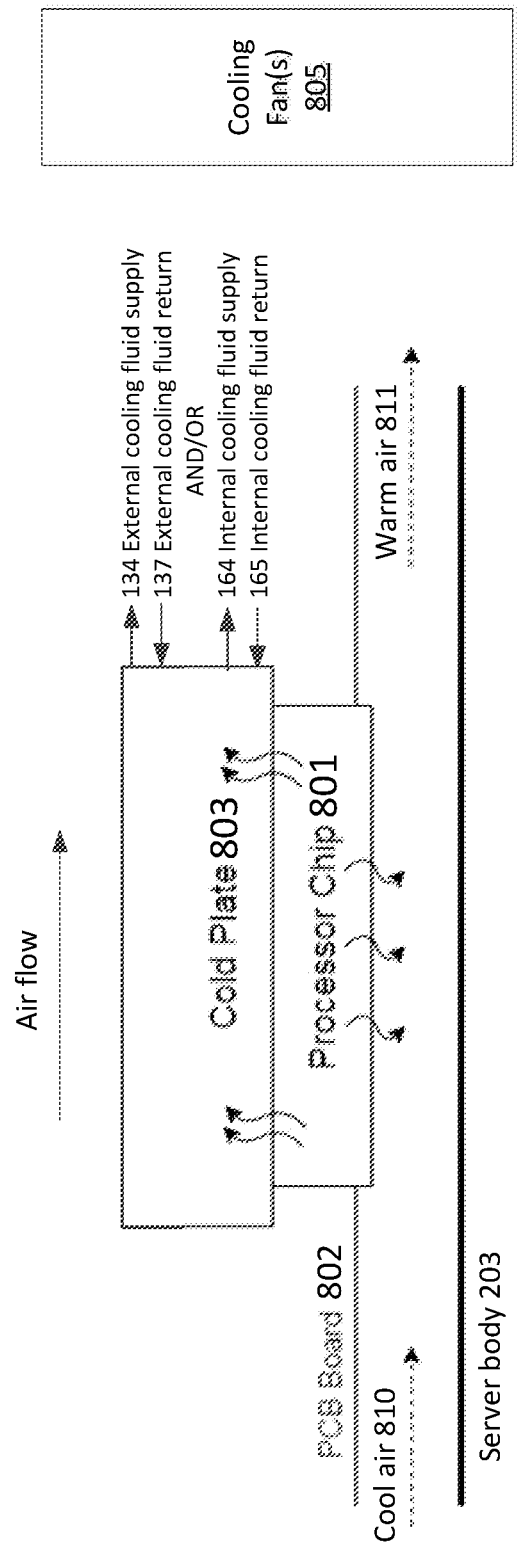
FIG. 8 is a block diagram of a cold plate assembly according to one embodiment.

FIG. 8 is a block diagram of cold plate assembly 800, according to one embodiment. The processor/cold plate assembly 800 can represent any of the processors/cold plate structures of server chassis 203 as shown in FIG. 6. Referring to FIG. 8, processor 801 is plugged onto a processor socket mounted on printed circuit board (PCB) or motherboard 802 coupled to other electrical components or circuits of a data processing system or server. Processor 801 also includes a cold plate 803 attached to it, which is coupled to a plurality of rack manifolds (not shown) that are coupled to an external cooling fluid supply 134 and return 137 or an internal cooling fluid supply 164 and return 165 via the plurality of rack manifolds. In an embodiment, cold plate 803 can support two independent cooling loops such that cold plate 803 can receive, and circulate, external cooling fluid supply 134 and internal cooling fluid supply 164 to remove heat from heat-generating components. In an embodiment, external cooling fluid supply 134 and return 137 can be circulated within cold plate 803 by a rack cooler (not shown) within an electronic rack (not shown). An embodiment using a rack cooler is described above with reference to FIG. 2 and FIG. 6. A portion of the heat generated by processor 801 is removed by the cooling fluid via cold plate 803. The remaining portion of the heat enters into an air space underneath or above, which may be removed by a cool airflow 810 generated by cooling fan(s) 805. The cool air 810 passes through the air space which heats the air to become warm air 811, which is exhausted out the back of the electronic rack (not shown) in which the server body 203 is installed.

In the foregoing specification, embodiments of the invention have been described with reference to specific exemplary embodiments thereof. While rack orientations are shown as horizontal, this is not limiting. Different server rack orientations, e.g. vertical, or upward/downward, can be implemented using this disclosure. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling system for an electronic rack, comprising:
   a heat exchange system comprising a heat exchanger, an internal cooling fluid filter, and an internal cooling fluid pump, wherein, when the heat exchange system is in an active mode, the heat exchange system is configured to:
      pump internal cooling fluid supply to the electronic rack having at least one server containing a first plurality of heat-generating components, and
      remove heat from an internal cooling fluid return from the electronic rack with the heat exchanger; and
   an external cooling fluid loop comprising an external cooling fluid pump, an external cooling fluid filter, an external cooling fluid supply valve, and an external cooling fluid return valve, wherein, when the heat exchange system is in an inactive mode, the external cooling fluid loop is configured in an active mode to pump filtered external cooling fluid supply to the first plurality of heat-generating components in the electronic rack via the internal cooling fluid supply.

2. The cooling system for the electronic rack of claim 1, wherein the filtered internal cooling fluid supply is coupled to the first plurality of heat-generating components via an internal cooling fluid supply manifold installed in the electronic rack, and the first plurality of heat-generating components are coupled to the internal cooling fluid return via an internal cooing fluid return manifold installed in the electronic rack.

3. The cooling system for the electronic rack of claim 1, wherein when the heat exchange system is in the active mode, the external cooling fluid loop is configured to:
   deactivate the external cooling fluid pump and close the external cooling fluid supply valve and close the external cooling fluid return valve.

4. The cooling system for the electronic rack of claim 1, further comprising:
   a second plurality of heat-generating components in the at least one server in the electronic rack, wherein the second plurality of heat-generating components is coupled to the filtered external cooling fluid supply;
   wherein the second plurality of heat-generating components is coupled to an external cooling fluid return; and
   wherein the second plurality of heat-generating components is distinct from the first plurality of heat-generating components.

5. The cooling system for the electronic rack of claim 4, further comprising:
   an external cooling fluid supply manifold installed in the electronic rack, wherein the external cooling fluid supply is coupled to the second plurality of heat-generating components via the external cooling supply manifold; and
   an external cooling fluid return manifold installed in the electronic rack, wherein the second plurality of heat-generating components is coupled to the external cooling fluid return via the external cooling fluid return manifold.

6. The cooling system for the electronic rack of claim 4, wherein the external cooling fluid loop is configured to be in the active mode independent of the heat exchange system being in the active mode or the inactive mode.

7. The cooling system for the electronic rack of claim 4, further comprising:
   a rack cooler in the electronic rack, wherein the rack cooler is configured to provide cooling of any heat-generating component of the plurality of heat-generating components and the second plurality heat-generating components in the at least one server.

8. A cooling system for an information technology (IT) cluster, comprising:
   an external cooling fluid loop including an external cooling fluid supply coupled to an external cooling fluid filter; and
   a plurality of heat exchange systems, each heat exchange system comprising:
      a heat exchanger and an internal cooling fluid pump, wherein, when the heat exchange system is in an active mode, the heat exchange system is configured to pump an internal cooling fluid supply to an electronic rack having at least one server containing a plurality of heat-generating components, and to remove heat from an internal cooling fluid return collected from the plurality of heat-generating components, and
      wherein a branch off of the external cooling fluid supply is coupled, via an external cooling fluid supply valve, to the internal cooling fluid supply;
      a branch off of an external cooling fluid return is coupled to the internal cooling fluid return via an external cooling fluid return valve; and
      when the heat exchange system is configured in an inactive mode, the external cooling fluid loop is configured to circulate filtered external cooling fluid to the electronic rack.

9. The cooling system for the IT cluster of claim 8, wherein, when the heat exchange system is in the active mode, the external cooling fluid supply valve and the external cooling fluid return valve are both closed.

10. The cooling system for the IT cluster of claim 8, wherein, for the each heat exchange system, the electronic rack includes:
  an internal cooling fluid supply manifold, wherein the internal cooling fluid supply manifold is configured to the distribute internal cooling fluid supply to each of the at least one server that contains at least one of the plurality of heat-generating components; and
  an internal cooling fluid return manifold, configured to collect the internal cooling fluid return from each of the at least one server that contains at least one of the plurality of heat-generating components.

11. The cooling system for the IT cluster of claim 10, wherein, for the each heat exchange system in the IT cluster, the external cooling fluid supply valve and the external cooling fluid return valve are configured to open in response to one of:
  the heat exchanger being in an inactive state, such that the plurality of heat-generating components in the electronic rack are cooled by the external cooling fluid supply, or
  a temperature of the internal cooling fluid supply being hotter than a threshold value, such that the plurality of heat-generating components in the electronic rack are cooled by both the internal cooling fluid supply and the external cooling fluid supply.

12. The cooling system for the IT cluster of claim 8, wherein, for the each heat exchange system in the IT cluster, when the external cooling fluid supply valve is open, and the external cooling fluid return valve is open, the external cooling fluid supply is delivered to the electronic rack.

13. The cooling system for the IT cluster of claim 8, wherein, the external cooling fluid supply filter is configured for a flow capacity that is capable of delivering the external cooling fluid supply to each of the plurality of heat exchange systems and associated racks in the IT cluster simultaneously, as a full backup to the internal cooling fluid supply in each and every heat exchange system in the IT cluster.

14. The cooling system for the IT cluster of claim 8, wherein, for each heat exchange system in the IT cluster, the heat exchange system further includes an internal cooling fluid filter coupled between the heat exchanger and the internal cooling fluid supply pump, and wherein a filtration quality of the internal cooling fluid filter is higher than a corresponding filtration quality of the external cooling fluid filter.

15. A data center, comprising:
  a first plurality of IT clusters and a second plurality of IT clusters, each of the first and second plurality of IT clusters including:
    an external cooling fluid loop including:
      an external cooling fluid supply pump,
      an external cooling fluid supply filter,
      an external cooling fluid supply coupled to the external cooling fluid supply filter, and
      an external cooling fluid return;
    a plurality of heat exchange systems, each heat exchange system being associated with an electronic rack having at least one server and containing a plurality of heat-generating components, each heat exchange system including:
      a heat exchanger having an internal cooling loop including an internal cooling fluid filter, an internal cooling fluid pump, and an internal cooling fluid supply, wherein, when the heat exchange system is in an active mode, the heat exchange system is configured to pump filtered internal cooling fluid supply to the plurality of heat-generating components, and to remove heat collected from the plurality of heat-generating components and transferred to an internal cooling fluid return,
    wherein the external cooling fluid supply is coupled, via an external cooling fluid supply valve, to the internal cooling fluid supply, and
    wherein the external cooling fluid return is coupled to the internal cooling fluid return via an external cooling fluid return valve.

16. The data center of claim 15, wherein, for the each cluster of the first and second plurality of IT clusters, a filtration quality of the internal cooling fluid filter is higher than a corresponding filtration quality of the external cooling fluid filter.

17. The data center of claim 15, wherein, for each heat exchange system, when the heat exchange system is in the active mode, the external cooling fluid supply valve and the external cooling fluid return valve are both closed.

18. The data center of claim 17, wherein the external cooling fluid supply pump for each of the first and second plurality of IT clusters is sized and configured to be a full backup, simultaneously, for at least one other external cooling fluid supply pump of the first or the second plurality of IT clusters.

19. The data center of claim 15, wherein an outlet of the external cooling liquid supply pump of the each IT cluster of the first plurality of IT clusters is coupled to an outlet of the external cooling liquid supply pump in the each IT cluster of the second plurality of IT clusters.

20. The data center of claim 15, wherein, actuation of the external cooling fluid supply as a backup to the internal cooling fluid supply for each heat exchange system can be controlled via the external cooling fluid supply valve coupled to the internal cooling fluid supply and the external cooling fluid return valve coupled to the internal cooling fluid return.

* * * * *